(12) United States Patent
Itahashi et al.

(10) Patent No.: US 9,202,842 B2
(45) Date of Patent: Dec. 1, 2015

(54) METHOD FOR MANUFACTURING PHOTOELECTRIC CONVERSION DEVICE

(71) Applicant: CANON KABUSHIKI KAISHA, Tokyo (JP)

(72) Inventors: Masatsugu Itahashi, Yokohama (JP); Kenji Togo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 108 days.

(21) Appl. No.: 13/705,499

(22) Filed: Dec. 5, 2012

(65) Prior Publication Data
US 2013/0183786 A1    Jul. 18, 2013

(30) Foreign Application Priority Data
Jan. 16, 2012 (JP) ................. 2012-006554

(51) Int. Cl.
*H01L 31/18* (2006.01)
*H01L 27/146* (2006.01)
*H01L 27/01* (2006.01)

(52) U.S. Cl.
CPC .... *H01L 27/14685* (2013.01); *H01L 27/14689* (2013.01); *H01L 27/14612* (2013.01)

(58) Field of Classification Search
CPC ........... H01L 27/14643; H01L 27/14609; H01L 27/14612; H01L 27/1463; H01L 31/1864; H01L 27/14625; H01L 27/1464; H01L 27/14689; H01L 27/14685; H01L 27/14806; H01L 27/14605; H01L 31/035281; H01L 31/1868

USPC ........................................... 438/60
See application file for complete search history.

(56) References Cited

U.S. PATENT DOCUMENTS 6,448,595 B1 * 9/2002 Hsieh et al. ............. 257/292
6,570,222 B2    5/2003 Nozaki et al.
(Continued)

FOREIGN PATENT DOCUMENTS

JP   2001-345439 A   12/2001
JP   2005-260076 A    9/2005
(Continued)

*Primary Examiner* — Julia Slutsker
*Assistant Examiner* — Natalia Gondarenko
(74) *Attorney, Agent, or Firm* — Fitzpatrick, Cella, Harper & Scinto (57) ABSTRACT

A method for manufacturing a conversion device is provided. Formed are an insulating layer that covers at least conversion portion is formed; a protection layer for suppressing formation of a metal-semiconductor compound layer, at a position where the protection layer covers the conversion portion via the insulating layer, covers at least part of an element isolation region, and exposes a transistor; and a metal film on the protection layer and the transistor. A metal-semiconductor compound layer on the transistor by performing heating process is formed. Metal that has not been reacted by the heating process is removed from the substrate. After that, an upper side in portions of the protection layer covering the conversion portion and the at least part of the element isolation region are removed.

17 Claims, 6 Drawing Sheets

(56) References Cited

U.S. PATENT DOCUMENTS

| | | |
|---|---|---|
| 6,642,087 B2 | 11/2003 | Nozaki et al. |
| 7,361,542 B2 | 4/2008 | Shim |
| 7,387,926 B2 | 6/2008 | Han |
| 7,993,951 B2 | 8/2011 | Okabe et al. |
| 8,293,559 B2 | 10/2012 | Okabe et al. |
| 2005/0205955 A1 | 9/2005 | Shim |
| 2007/0013011 A1* | 1/2007 | Yoshizawa et al. ........... 257/409 |
| 2008/0258188 A1 | 10/2008 | Kao |
| 2009/0020795 A1 | 1/2009 | Doi et al. |
| 2009/0289282 A1* | 11/2009 | Tsuno ........................... 257/219 |
| 2010/0059662 A1* | 3/2010 | Rhodes ...................... 250/208.1 |
| 2010/0330723 A1* | 12/2010 | Okabe et al. .................... 438/59 |

FOREIGN PATENT DOCUMENTS

| | | |
|---|---|---|
| JP | 2005-354075 A | 12/2005 |
| JP | 2006-049921 A | 2/2006 |
| JP | 2006-191054 A | 7/2006 |
| JP | 2009-026848 A | 2/2009 |
| JP | 2011-029604 A | 2/2011 |

\* cited by examiner

METHOD FOR MANUFACTURING PHOTOELECTRIC CONVERSION DEVICE

BACKGROUND OF THE INVENTION

1. Field of the Invention

The present invention relates to a method for manufacturing a photoelectric conversion device.

2. Description of the Related Art

Regarding a photoelectric conversion device, there is a known technique for reducing contact resistance between source-drain regions and a gate electrode of a MOS transistor, by providing these regions with a metal-semiconductor compound layer (silicide layer) containing a compound of a high melting point metal and a semiconductor. If a silicide layer is formed on a photoelectric conversion portion, a current leakage at the photoelectric conversion portion increases, and the photoelectric conversion characteristics deteriorate. Thus, in Japanese Patent Laid-Open No. 2009-026848, formation of a silicide layer on a photoelectric conversion portion is suppressed by covering the photoelectric conversion portion with a silicon nitride film that functions as a protection layer and then forming a silicide layer. Furthermore, in Japanese Patent Laid-Open No. 2009-026848, an upper side in a portion of the silicon nitride film covering the photoelectric conversion portion is removed by etching, thereby adjusting the film thickness of the above-described silicon nitride film that functions also as an antireflection film for the photoelectric conversion portion.

SUMMARY OF THE INVENTION

An aspect of the present invention provides a method for manufacturing a photoelectric conversion device, comprising: preparing a semiconductor substrate having a photoelectric conversion portion, an element isolation region that is adjacent to the photoelectric conversion portion, and a transistor; forming an insulating layer that covers at least the photoelectric conversion portion; forming a protection layer for suppressing formation of a metal-semiconductor compound layer, at a position where the protection layer covers the photoelectric conversion portion via the insulating layer, covers at least part of the element isolation region, and exposes the transistor; forming a metal film on the protection layer and the transistor; forming a metal-semiconductor compound layer on the transistor by performing heating process, after forming the metal film; removing metal of the metal film that has not been reacted by the heating process, from the semiconductor substrate; and after removing the unreacted metal, removing at least an upper side in portions of the protection layer covering the photoelectric conversion portion and the at least part of the element isolation region.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

The inventors found that, after a silicide layer has been formed, a protection layer that suppresses formation of the silicide layer on a photoelectric conversion portion contains a relatively high concentration (approximately $1.0 \times 10^{12}$ to $1.0 \times 10^{13}$ [$cm^{-2}$]) of high melting point metal. There is a possibility that the high melting point metal that has remained in the protection layer is diffused to the photoelectric conversion portion, so that the current leakage increases at a pixel region, and the photoelectric conversion characteristics deteriorate. In Japanese Patent Laid-Open No. 2009-026848, an upper side in a portion of a protection layer covering a photodiode for formation of an antireflection film is removed. It seems that this processing removes the high melting point metal that has remained in that portion. However, as described in Paragraph 0088, the protection layer is not removed in regions other than the region that covers the photodiode, in order to suppress transmission of incident light. Since the high melting point metal has remained also in regions of the protection layer other than the region that covers the photodiode, the possibility that the high melting point metal is diffused to the photoelectric conversion portion still remains. Thus, an aspect of the present embodiments provides a technique for reducing the amount of metal that is diffused to the photoelectric conversion portion in the photoelectric conversion device.

Hereinafter, embodiments will be described in detail with reference to the appended drawings. In the various embodiments below, the same components are denoted by the same reference numerals, and a description thereof will not be repeated. In the embodiments below, a description will be given regarding a method for manufacturing a CMOS-type photoelectric conversion device. However, the present invention can be applied to any photoelectric conversion device having a semiconductor substrate having a photoelectric conversion portion, an element isolation region that is adjacent to the photoelectric conversion portion, and a transistor having a metal-semiconductor compound layer (silicide layer). Examples of such photoelectric conversion devices include a CCD-type photoelectric conversion device. Furthermore, in the embodiments below, a case in which electrons are used as a signal charge will be described, but the present invention can be applied also to a case in which holes are used as a signal charge. Furthermore, the embodiments can be modified or combined as appropriate.

Hereinafter, a method for manufacturing a photoelectric conversion device according to a first embodiment of the present invention will be described with reference to the cross-sectional views illustrated in FIGS. 1A to 1D and 2A to 2C. A CMOS-type photoelectric conversion device according to this embodiment may have a semiconductor substrate 100 that includes a pixel region 101 in which a pixel array is formed and a peripheral circuit region 102 in which a peripheral circuit is formed. In the pixel region 101, a plurality of pixels are formed each having an accumulation region of a photodiode that functions as a photoelectric conversion portion, a MOS transistor that is for transferring charges generated by the photoelectric conversion portion, and the like. In the peripheral circuit region 102, a circuit that is for providing a driver to read signals from the pixel array and a circuit that is for processing output signals from the pixel array are formed. In the description below, the pixel region 101 will be described focusing on part of one pixel, and the peripheral circuit region 102 will be described focusing on one MOS transistor that is an example of a peripheral circuit. The semiconductor substrate 100 may be formed by silicon.

Figure 1A:
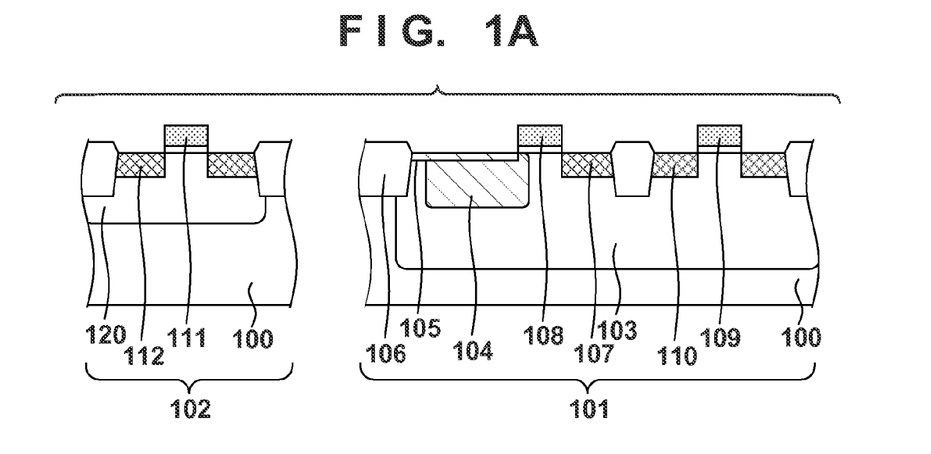
FIGS. 1A to 1D illustrate a method for manufacturing a photoelectric conversion device according to a first embodiment of the present invention.

First, the semiconductor substrate 100 as shown in FIG. 1A is prepared. This semiconductor substrate 100 may be prepared using an existing method, and the structure thereof will be briefly described below. The semiconductor substrate 100 is, for example, an n-type silicon single crystalline substrate. The semiconductor substrate 100 may be another type of substrate or may be an epitaxial layer disposed on a substrate. The pixel region 101 and the peripheral circuit region 102 can be manufactured by a common CMOS manufacturing process on the same semiconductor substrate. The semiconductor substrate 100 may have a p-type well region (semiconductor region) 103 in the pixel region 101. The well region 103 is optimized according to the characteristics of the photodiode, and the junction depth, the impurity concentration, and the like are arbitrarily set.

In the well region 103, an accumulation region 104 that is an n-type semiconductor region of a photodiode is formed. The photodiode may further have a p-type semiconductor layer 105 on the surface of the semiconductor substrate 100. An element isolation region 106 that is made of a silicon oxide film is disposed adjacent to the accumulation region 104 and the semiconductor layer 105 of the photodiode. The well region 103 may further have an n-type semiconductor region that functions as a floating diffusion region 107 for holding electrons transferred from the accumulation region 104. A gate electrode 108 is formed at a position where it covers, via a gate insulating film, a region between the accumulation region 104 and the floating diffusion region 107. The gate electrode 108, the accumulation region 104, and the floating diffusion region 107 form a transfer MOS transistor, and electrons generated by the photodiode and accumulated in the accumulation region 104 are transferred to the floating diffusion region 107 by controlling the voltage at the gate electrode 108. The pixel region 101 further has an n-type MOS transistor configured by a gate electrode 109 and a semiconductor region 110 that functions as a source region or drain region. This MOS transistor may be, for example, a MOS transistor for resetting the accumulation region 104 or may be a MOS transistor for amplifying and outputting signals according to charges held by the floating diffusion region 107.

In the semiconductor substrate 100, the peripheral circuit region 102 may have a p-type well region (semiconductor region) 120. The peripheral circuit region 102 may further have an n-type MOS transistor configured by a gate electrode 111 and a semiconductor region 112 that functions as a source region or drain region. Although not shown, in the semiconductor substrate 100, the peripheral circuit region 102 may have an n-type well region, and a p-type MOS transistor may be formed in that well region. The MOS transistor formed in the peripheral circuit region 102 may function, for example, as part of a drive circuit for driving the MOS transistors in the pixel array or a signal processing circuit for processing signals from the pixel array.

Figure 1B:
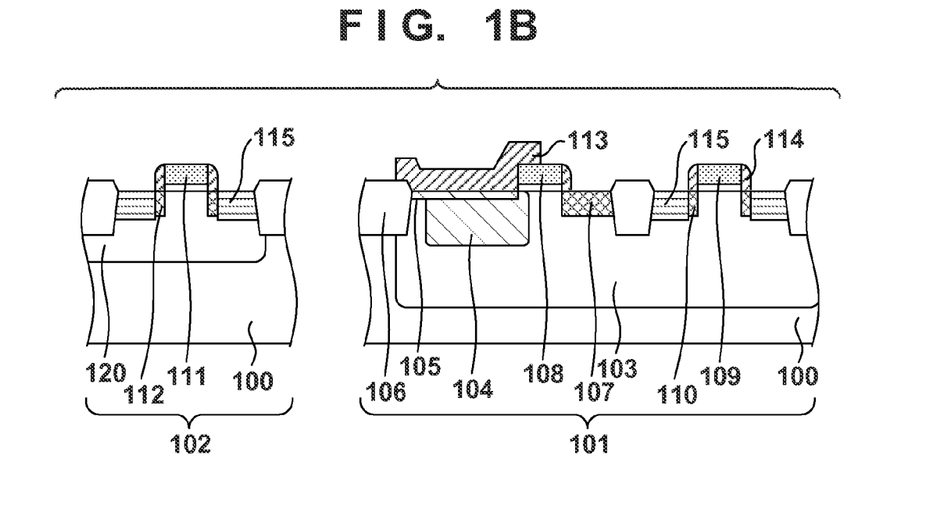

Next, as shown in FIG. 1B, an insulating layer 113, side spacers 114, and high-concentration semiconductor regions 115 are formed. First, on the semiconductor substrate 100 prepared as shown in FIG. 1A, for example, an insulating film made of a silicon nitride film, a silicon oxide film, a silicon oxynitride film, or a laminated film including at least any of them is formed. Subsequently, this insulating film is subjected to photolithography and etching, thereby forming the insulating layer 113 that covers the accumulation region 104 of the photodiode as shown in FIG. 1B. The insulating layer 113 further covers part of the gate electrode 108 and part of the element isolation region 106 adjacent to the photodiode. Furthermore, the insulating layer for forming the insulating layer 113 remains on the side faces of the gate electrodes 108, 109, and 111, and functions as the side spacers 114. The insulating film is removed at positions other than the above, that is, positions where it covers the floating diffusion region 107, the semiconductor region 110, the gate electrode 109, and the peripheral circuit region 102. Then, the high-concentration n-type semiconductor regions (diffusion layers) 115 are formed in the semiconductor regions 110 and 112, and, thus, a MOS transistor having an LDD structure is formed. In this embodiment, the high-concentration n-type semiconductor region 115 is not formed in the floating diffusion region 107, and, thus, the capacitance of the floating diffusion region 107 can be made smaller than that in the case where the n-type semiconductor region 115 is formed therein. Note that the high-concentration n-type semiconductor region 115 may be formed also in the floating diffusion region 107. The impurity concentration of the high-concentration n-type semiconductor region 115 is higher than that of the floating diffusion region 107 and the semiconductor regions 110 and 112.

Figure 1C:
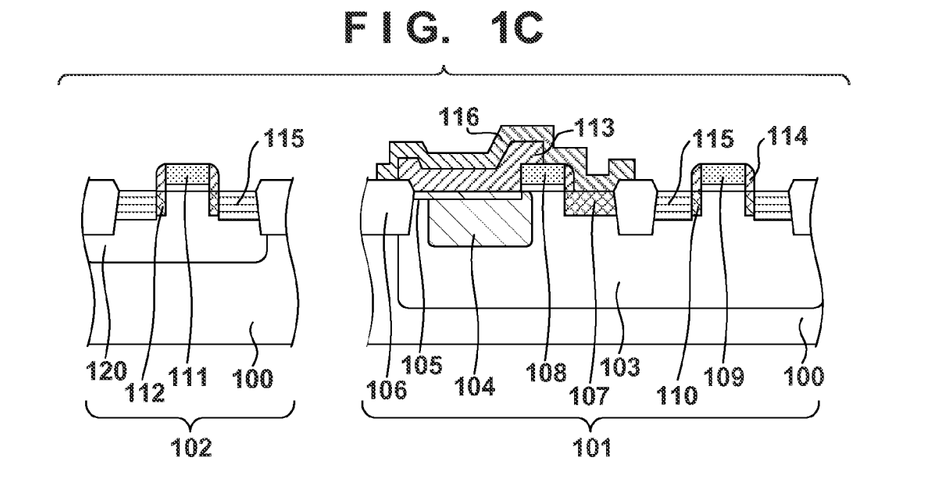

Next, as shown in FIG. 1C, a protection layer 116 is formed (first formation step). For this purpose, first, an insulating film (e.g., a silicon nitride film, a silicon oxide film, a silicon oxynitride film, etc.) that covers the semiconductor regions 115, the insulating layer 113, and the like shown in FIG. 1B is formed using the CVD method, the PVD method, or the like. Then, part of the thus formed insulating film is removed, and, thus, the protection layer 116 is formed. The protection layer 116 is formed at a position where it covers the insulating layer 113 and the vicinity of the insulating layer 113. Specifically, via the insulating layer 113, the protection layer 116 covers the accumulation region 104 and the semiconductor layer 105 of the photodiode, part of the element isolation region 106, and part of the gate electrode 108. Furthermore, without involving the insulating layer 113, the protection layer 116 covers another part of the element isolation region 106, another part of the gate electrode 108, the floating diffusion region 107, and part of an element isolation region adjacent to the floating diffusion region 107. Meanwhile, the protection layer 116 is not formed at positions where it covers the gate electrode 109 of the pixel region 101, the semiconductor regions 115, and the peripheral circuit region 102.

The protection layer 116 may be formed at a position where it covers a region in which a resistive element having high resistance is formed. As described later, a silicide layer is not formed in a region that is covered by the protection layer 116, and, thus, the resistance can be prevented from being lowered by the silicide layer.

Figure 1D:
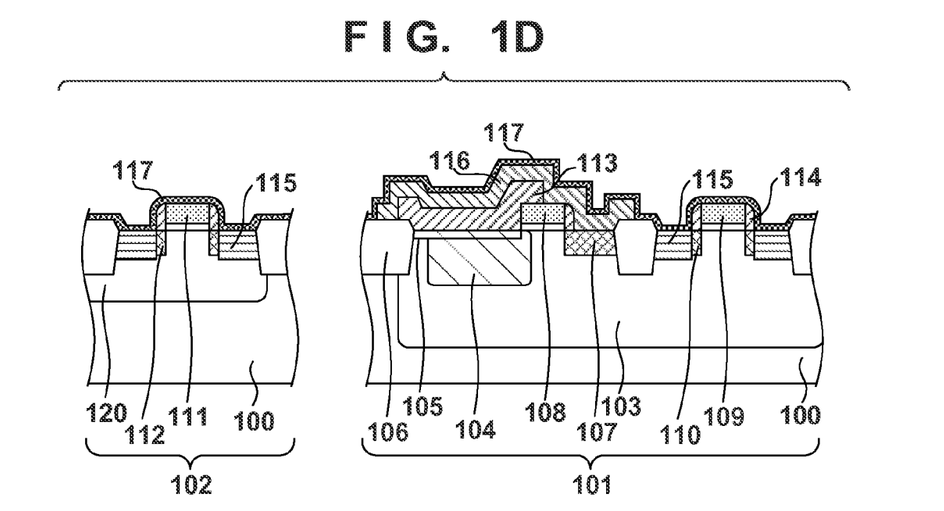

Next, as shown in FIG. 1D, a laminated film 117 including a high melting point metal film and an antioxidation film of this high melting point metal is formed in a layered manner so as to cover the entire semiconductor substrate 100 using CVD, sputtering, or the like (second formation step). The antioxidation film is disposed on the high melting point metal film. For example, the high melting point metal film is made of cobalt, and the antioxidation film is made of titanium nitride. The high melting point metal film may be made of, for example, titanium, nickel, tungsten, molybdenum, tantalum, chromium, palladium, or platinum. Furthermore, the antioxidation film is a film for preventing the high melting point metal film from being oxidized, and may be made of, for example, nickel nitride. The high melting point metal is metal capable of forming compound with semiconductor such as silicon.

Figure 2A:
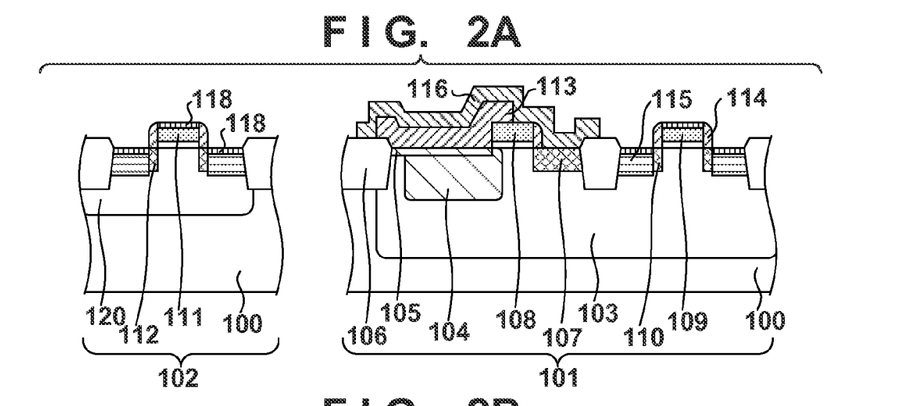
FIGS. 2A to 2C illustrate the method for manufacturing a photoelectric conversion device according to the first embodiment of the present invention.

Next, as shown in FIG. 2A, silicide layers (metal-semiconductor compound layers) 118 are formed, by subjecting the laminated film 117 to annealing, thereby causing the high melting point metal contained in the laminated film 117 and the semiconductor contained in the semiconductor substrate 100 to react with each other to form a silicide (third formation step). In this embodiment, the silicide layers 118 are formed on the upper side (surface portions) in the gate electrodes 109 and 111 and the semiconductor regions 115. In the case where the high melting point metal is cobalt and the semiconductor regions are made of silicon, annealing at a temperature of approximately 500° C. forms cobalt monosilicide (CoSi). It is possible to form silicide layers 118 made of other various materials by using other materials as the high melting point metal. Examples of such materials include titanium silicide, nickel silicide, cobalt silicide, tungsten silicide, molybdenum silicide, tantalum silicide, chromium silicide, palladium silicide, platinum silicide, and the like. Subsequently, the laminated film 117 containing unreacted high melting point metal film is immersed in sulfuric acid-hydrogen peroxide mixture, and, thus, the antioxidation film and the unreacted high melting point metal are removed from the upper side of the semiconductor substrate 100 (first removal step). Even if the treatment with sulfuric acid-hydrogen peroxide mixture is performed, the protection layer 116 hardly dissolves. In this case, annealing can be performed by heating process.

Even if the annealing for forming the silicide layers 118 is performed, the silicide layer is not formed on a region that is covered by the protection layer 116. That is to say, the protection layer 116 has a function of suppressing formation of a silicide layer. However, due to the annealing, the high melting point metal is diffused to the upper side (surface portion) in the protection layer 116, which has been in direct contact with the laminated film 117 containing the high melting point metal film. The high melting point metal diffused to the upper side in the protection layer 116 still remains at a concentration of approximately $1.0\times10^{12}$ to $1.0\times10^{13}$ [cm$^{-2}$] even if the treatment with sulfuric acid-hydrogen peroxide mixture is performed. Thus, in this embodiment, the upper side in a portion of the protection layer 116 covering the accumulation region 104 of the photodiode and part of the element isolation region 106 is removed (second removal step). The upper side refers to a portion from the center to the surface of the protection film. The upper side may be completely removed, or may be partially removed. Furthermore, the entire protection film may be removed.

Figure 2B:
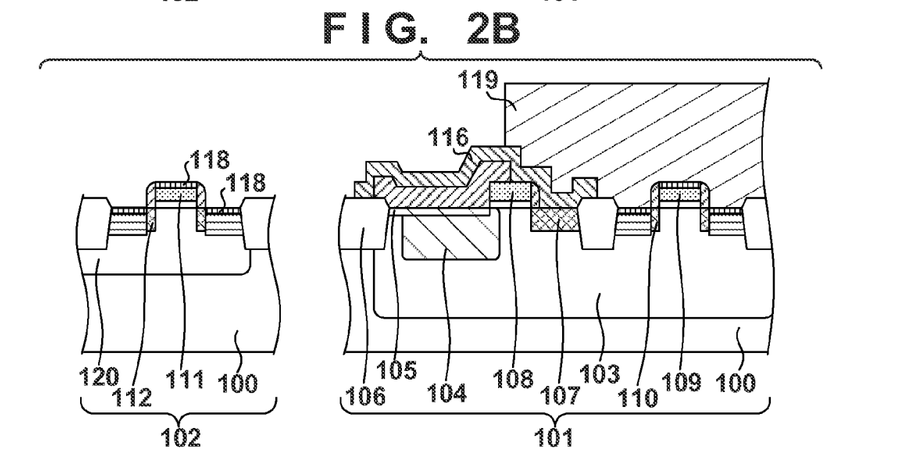

Thus, as shown in FIG. 2B, a resist pattern 119 is formed by applying a resist onto the semiconductor substrate 100 and performing patterning. In the protection layer 116, the resist pattern 119 exposes the portion that covers the accumulation region 104 of the photodiode and part of the element isolation region 106, and covers the other portions. Subsequently, the protection layer 116 that is exposed by the resist pattern 119 is immersed in an acidic solution such as hydrofluoric acid or ammonia-hydrogen peroxide mixture or an alkaline solution. Accordingly, most of the high melting point metal that has remained in the protection layer 116 can be removed.

Figure 2C:
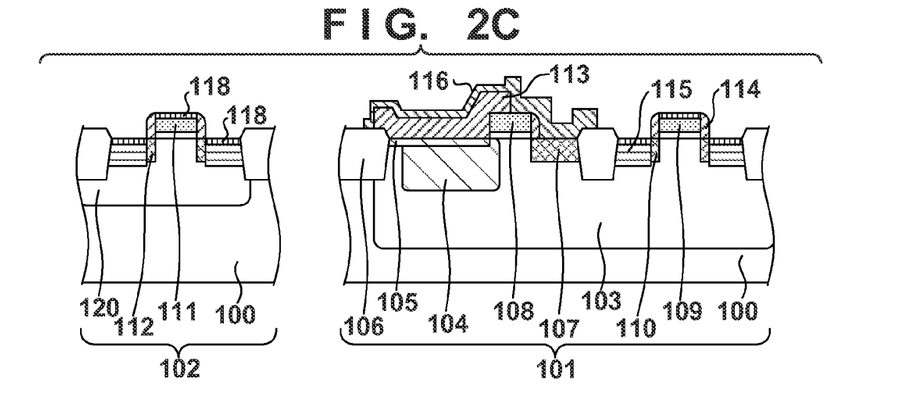

In the foregoing example, the upper side in the protection layer 116 is removed using wet etching, but dry etching may be used instead. Furthermore, a portion of the protection layer 116 covering part of the gate electrode 108 is covered by the resist pattern 119, but the resist pattern 119 may be formed such that the resist pattern 119 exposes all the surface of the protection layer 116 covering the gate electrode 108. In this case, the high melting point metal that has remained in the protection layer 116 can be further removed. Then, the resist pattern 119 is removed, and, thus, a structure as shown in FIG. 2C is formed. In this structure, the upper side in the protection layer 116 has been removed, but any structure is possible as long as at least the upper side is removed, and the entire portion of the protection layer 116 that is exposed by the resist pattern 119 may be removed.

Then, the silicide layers 118 are further subjected to annealing. In order to form cobalt disilicide ($CoSi_2$) having resistance lower than that of cobalt monosilicide for forming the silicide layers 118, the annealing is performed at a temperature of approximately 800° C., which is higher than the temperature in the previous annealing. With this treatment, the silicide layers 118 are completed. Note that, if the high melting point metal is further removed from the protection layer 116 after the cobalt disilicide is formed, it is possible to reduce the amount of high melting point metal that is diffused to the accumulation region 104 of the photodiode at the time of subsequent annealing. In the manufacturing method of this embodiment, a description was given with reference to an example of cobalt disilicide forming method, but the manufacturing method can be changed as appropriate.

Subsequently, an existing method may be used to complete a photoelectric conversion element. For example, an insulating layer including a silicon oxide film, a silicon oxide film containing boron or phosphorus, or the like is formed on the semiconductor substrate 100. Next, contact holes are formed through this insulating layer using the photolithography technique or the etching technique. Then, a single-layered or multi-layered metal film is formed using the CVD method or the like, and excessive metal film is removed using the CMP method or the like, so that a contact plug is formed. Contact holes that expose portions in which the silicide layers 118 are formed and contact holes that expose portions in which the silicide layers 118 are not formed may be separately formed. In the case where contact is established with respect to gate electrodes or source-drain regions on which the silicide layer 118 is not formed, an impurity region may be formed by applying impurities via appropriate contact holes into the well regions 103 and 120 before forming a contact plug. Accordingly, the contact resistance can be stabilized. Even when annealing is performed in order to activate the impurities, since most of the high melting point metal has been removed from the protection layer 116, the amount of high melting point metal that is diffused to the accumulation region 104 of the photodiode is small. Furthermore, after forming contact holes with respect to gate electrodes or source-drain regions on which the silicide layer 118 is not formed and before forming a contact plug, inner portions of the contact holes may be cleaned using an acidic solution such as hydrofluoric acid or ammonia-hydrogen peroxide mixture or an alkaline solution.

Furthermore, when using the metal CVD method in order to form a contact plug, deposition may be performed at a relatively high temperature. However, even with such deposition at a high temperature, the amount of high melting point metal that is diffused to the accumulation region 104 of the photodiode is small as in the above-described case. Then, a wiring layer made of metal such as aluminum or copper is formed on the pixel region 101 and the peripheral circuit region 102. Subsequently, insulating layers, via plugs, wiring layers may be further formed, and color filters and microlenses are formed to complete a photoelectric conversion device.

According to this embodiment, in a photoelectric conversion device having a silicide layer, the amount of high melting point metal that is diffused to the photoelectric conversion portion can be reduced, and, thus, a current leakage at the photoelectric conversion portion can be reduced. In the foregoing example, diffusion of the high melting point metal to the photoelectric conversion portion is suppressed, but this embodiment can be applied in a similar manner to any other components where diffusion of the high melting point metal is required to be suppressed.

Figure 3:
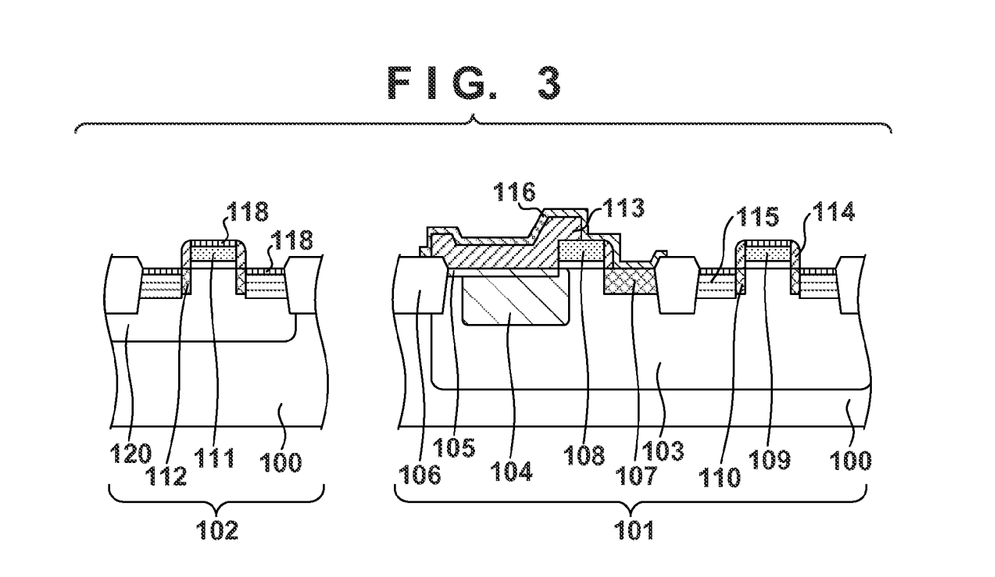
FIG. 3 illustrates a method for manufacturing a photoelectric conversion device according to a second embodiment of the present invention.

Subsequently, a method for manufacturing a photoelectric conversion device according to a second embodiment of the present invention will be described with reference to FIG. 3. The same components as those in the first embodiment are denoted by the same reference numerals, and a description thereof will not be repeated. This embodiment is the same as the first embodiment throughout the procedure to the point where the protection layer 116 shown in FIG. 2A is formed, but, in this embodiment, etching is performed on the entire protection layer 116 without forming the resist pattern 119, so that the upper side in the entire protection layer 116 is removed. Accordingly, the structure shown in FIG. 3 is obtained. The etching on the protection layer 116 may be performed using either wet etching or dry etching as in the first embodiment. Note that, in this case, it is sufficient that the portion of the protection layer 116 subjected to removal is thin, and, thus, the other silicide layers and the like are not significantly affected.

In this embodiment, since etching is performed on the entire protection layer 116, the high melting point metal can be removed from the protection layer 116 in a range wider than that of the first embodiment. Furthermore, since etching is performed without forming the resist pattern 119, portions of the element isolation regions in the pixel region 101, which have been in direct contact with the laminated film 117 containing the high melting point metal film, can be removed. There is a possibility that the high melting point metal has remained also in these portions of the element isolation regions, and, thus, if etching is performed to remove these portions, the high melting point metal that has unnecessarily remained can be further removed.

Figure 4A:
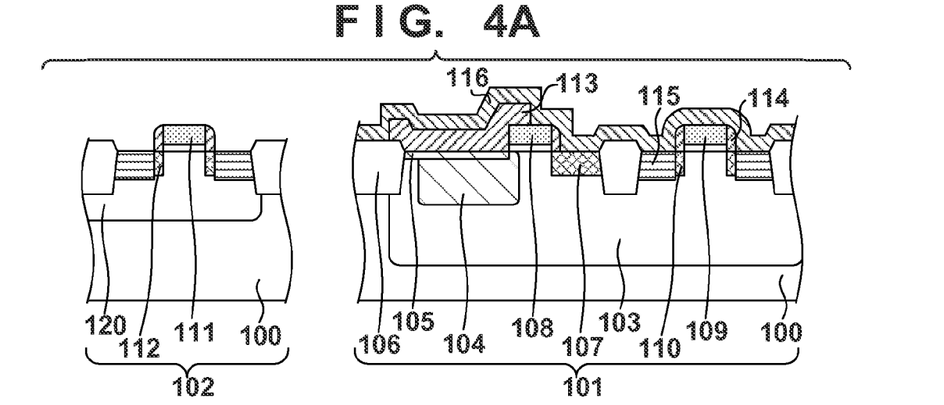
FIGS. 4A to 4C illustrate a method for manufacturing a photoelectric conversion device according to a third embodiment of the present invention.
Figure 4B:
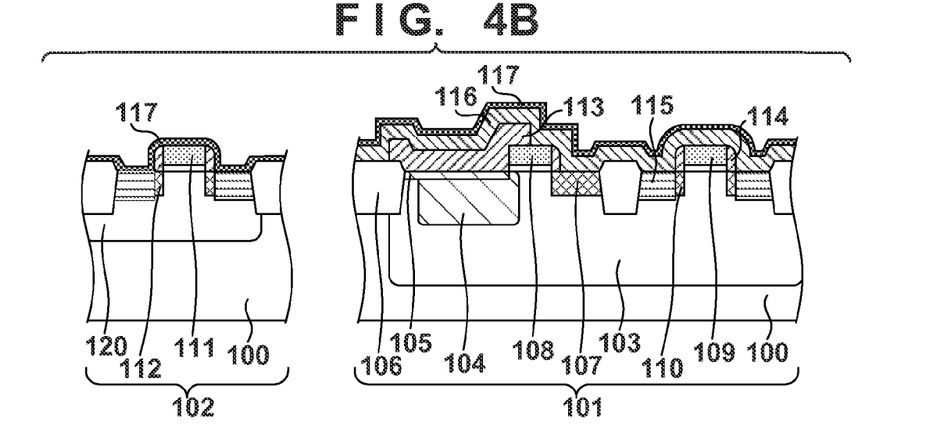
Figure 4C:
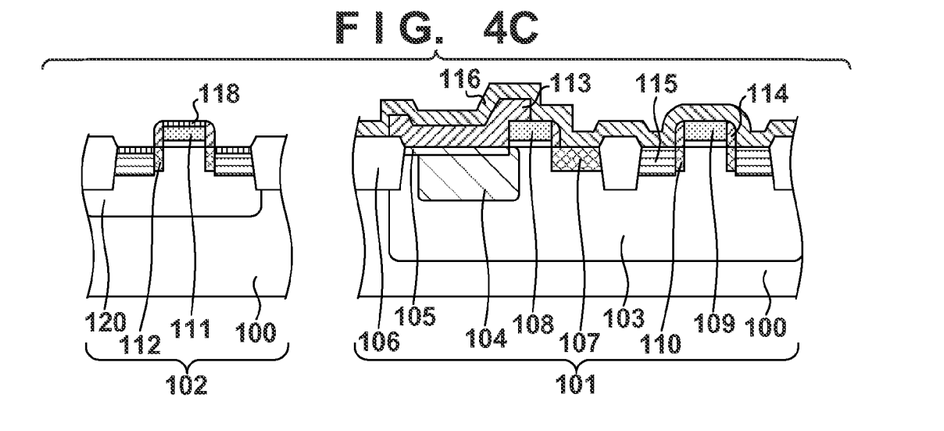

Subsequently, a method for manufacturing a photoelectric conversion device according to a third embodiment of the present invention will be described with reference to FIGS. 4A to 4C. The same components as those in the foregoing embodiments are denoted by the same reference numerals, and a description thereof will not be repeated. This embodiment is the same as the first embodiment throughout the procedure to the point where the insulating layer 113 shown in FIG. 1B is formed, but, in this embodiment, the protection layer 116 is formed so as to cover the entire surface of the pixel region 101 as shown in FIG. 4A. In the peripheral circuit region 102, the protection layer 116 is formed so as not to cover a region on which formation of a silicide layer is required. The protection layer 116 does not have to cover the peripheral circuit region 102 at all.

Next, as in the first embodiment, a laminated film 117 is formed so as to cover the entire semiconductor substrate 100 via the protection layer 116, and is subjected to annealing. Accordingly, in this embodiment, as shown in FIG. 4C, the silicide layers 118 are formed in the peripheral circuit region 102 whereas the silicide layer 118 is not formed in the pixel region 101. Then, an upper portion in part of the protection layer 116 may be removed after forming the resist pattern 119 as in the first embodiment, or an upper portion in the entire protection layer 116 may be removed without forming the resist pattern 119 as in the second embodiment. In this embodiment, since the silicide layer 118 is not formed in the pixel region 101, the possibility that the high melting point metal is diffused to the accumulation region 104 of the photodiode can be further reduced.

Figure 5:
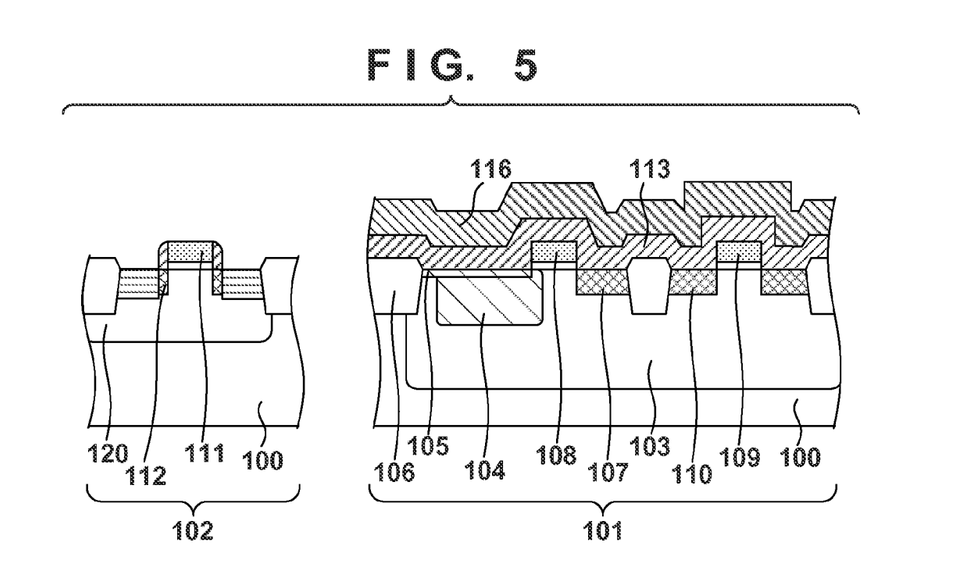
FIG. 5 illustrates a method for manufacturing a photoelectric conversion device according to a fourth embodiment of the present invention.

Subsequently, a method for manufacturing a photoelectric conversion device according to a fourth embodiment of the present invention will be described with reference to FIG. 5. The same components as those in the foregoing embodiments are denoted by the same reference numerals, and a description thereof will not be repeated. This embodiment is different from the third embodiment in that the insulating layer 113 is formed so as to cover the entire surface of the pixel region 101. The various modifications described in the third embodiment can be applied also to this embodiment. That is to say, the pixel region 101 is not provided with a transistor having an LDD structure.

In order to form the insulating layer 113 of this embodiment, a laminated film including a silicon nitride film on which at least one of a silicon oxide film and a silicon oxynitride film is laminated is formed on the semiconductor substrate 100 shown in FIG. 1A. Next, this laminated film is subjected to photolithography and etching to remove part of that film, thereby forming the insulating layer 113. As described above, the laminated film is not removed from the portion that covers the pixel region 101. Furthermore, in the portion that covers the peripheral circuit region 102, the laminated film is left in the regions in which the side spacers 114 are formed, and is removed from the portions that cover the semiconductor regions 115 and the gate electrode 111. Then, the protection layer 116 is formed, and the silicide layers 118 are formed.

Also in this embodiment, the upper portion in the protection layer 116 is removed, and, thus, most of the high melting point metal that has remained in the protection layer 116 is removed. Furthermore, the insulating layer 113, including a silicon nitride film having a high ability to prevent the high melting point metal from being diffused, is formed at a position where it covers the entire surface of the pixel region 101. Thus, even when the high melting point metal has remained in the protection layer 116, the possibility the high melting point metal is diffused via the protection layer 116 to the photodiode is low. This embodiment is particularly advantageous in the case where the element isolation region 106 is made of a silicon oxide film. Since the ability of a silicon oxide film to prevent the high melting point metal from being diffused is low, when the insulating layer 113 is not present between the element isolation region 106 and the protection layer 116, there is a possibility that the high melting point metal is diffused via the element isolation region 106 to the photodiode. In this embodiment, the insulating layer 113 including a silicon nitride film is disposed between the element isolation region 106 and the protection layer 116, and, thus, the possibility that the high melting point metal is diffused to the photodiode can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-006554, filed Jan. 16, 2012, which is hereby incorporated by reference herein in its entirety.

What is claimed is:

1. A method for manufacturing a photoelectric conversion device, comprising:
   preparing a semiconductor substrate having a pixel region in which a pixel array is formed and a peripheral circuit region in which a peripheral circuit for processing a signal from the pixel array is formed, the pixel region having a photoelectric conversion portion, a first gate electrode of a first transistor that is for transferring a charge generated by the photoelectric conversion portion to a floating diffusion region, and a second gate electrode of a second transistor for outputting signals according to charges held by the floating diffusion region, and the peripheral circuit region having a third gate electrode of a third transistor;
   forming an insulating layer that covers at least the photoelectric conversion portion, and a side spacer that covers a side face of the third gate electrode, the insulating layer and the side spacer being formed from a first insulating film that covers the photoelectric conversion portion, the first gate electrode, the second gate electrode, and the third gate electrode;
   forming a protection layer that covers the photoelectric conversion portion via the insulating layer and covers at least the first gate electrode, a second gate electrode, and the floating diffusion region, the protection layer being formed by forming a second insulating film and etching the second insulating film so that an upper face of the third gate electrode and a semiconductor region of the third transistor are exposed;
   forming a metal film on the protection layer, the side spacer, the upper face of the third gate electrode, and the semiconductor region of the third transistor;
   after the forming of the metal film, forming a metal-semiconductor compound layer on the semiconductor region of the third transistor by performing a heating process to react the metal film with the semiconductor region;
   after the forming of the metal-semiconductor compound layer, removing a portion of the metal film, the portion of the metal film being positioned on the protection layer; and
   after the removing of the portion of the metal film, removing at least first, second, third, and fourth portions of the protection layer, the first portion being positioned on the first gate electrode, the second portion being positioned on the second gate electrode, the third portion being positioned on the photoelectric conversion portion via the insulating layer, and the fourth portion being position on the floating diffusion region,
   wherein, in the removing of the first, second, third, and fourth portions of the protection layer, an upper part of the protection layer is removed while a bottom part of the protection layer remains.

2. The method according to claim 1, wherein, in the forming of the protection layer, the protection layer is formed so as to cover an entire surface of the pixel region.

3. The method according to claim 1, wherein the first insulating film includes a silicon nitride film, and the second insulating film includes a silicon oxide film.

4. The method according to claim 1, wherein in the forming of the insulating layer, the insulating layer is formed so as to cover an entire surface of the pixel region.

5. The method according to claim 1, wherein, in the removing of the portions of the protection layer, at least a part of the protection layer, which has been in direct contact with the metal film, is removed.

6. The method according to claim 1, further comprising, after the removing of the portion of the metal film and before the removing of the portions of the protection layer, forming a mask pattern covering other portions of the protection layer than the portions to be removed.

7. The method according to claim 1, wherein
   the insulating layer continuously covers the first gate electrode and the second gate electrode between the protection layer and the semiconductor substrate.

8. The method according to claim 1, wherein the first insulating film from which the insulating layer is formed is a laminated film including a silicon nitride film and a silicon oxide film.

9. The method according to claim 1, wherein the removing of the portions of the protection layer is performed using an acidic solution or an alkaline solution.

10. The method according to claim 1, wherein:
    the prepared semiconductor substrate has an element isolation region formed between the first transistor and the second transistor;
    in the forming of the metal-semiconductor compound layer, the insulating layer is positioned between the protection layer and the element isolation region; and
    the method further comprising, after the removing of the portion of the metal film, removing a fifth portion of the protection layer, the fifth portion being positioned on element isolation region via the insulating layer.

11. The method according to claim 1, wherein the second insulating film is formed after forming the insulating layer and the side spacer so as to cover the insulating layer, the side spacer and the upper face of the third gate electrode, and the semiconductor region of the third transistor.

12. The method according to claim 1, wherein in the removing of the portions of the protection layer, an entire surface of the protection layer is etched.

13. A method for manufacturing a CMOS-type photoelectric conversion device, comprising:
    preparing a semiconductor substrate having a pixel region in which a pixel array is formed and a peripheral circuit region in which a peripheral circuit for processing a signal from the pixel array is formed, a gate electrode of a first MOS transistor for amplifying being formed on the pixel region, and a gate electrode of a second MOS transistor for driving or signal processing being formed on the peripheral circuit region;
    forming a first layer that covers a photoelectric conversion portion, a floating diffusion region, the gate electrode of the first MOS transistor, and a semiconductor region of the first MOS transistor and that does not cover the gate electrode of the second MOS transistor and a semiconductor region of the second MOS transistor, the first layer being formed from an insulating film;
    forming a metal film that covers the first layer, the gate electrode of the second MOS transistor, and a semiconductor region of the second MOS transistor;
    forming a second layer on the gate electrode of the second MOS transistor and the semiconductor region of the second MOS transistor, the second layer being a silicide layer containing a metal of the metal film; and
    etching the first layer over an entire surface of the first layer, after forming the second layer, wherein, in the etching of the first layer, an upper portion of the first layer is removed while a bottom portion of the first layer remains.

14. The method according to claim 13, wherein in the forming of the first layer, the first layer is formed so as to cover an entire surface of the pixel region.

15. The method according to claim 13, wherein the first layer is formed from a silicon oxide film, and an insulating layer formed from a silicon nitride film is disposed between the first layer and an upper face of the gate electrode of the first MOS transistor.

16. The method according to claim 13, wherein in the forming of the second layer, performing a first heating process, and after the etching the first layer, performing a second heating process, wherein a temperature of the first heating process is lower than that of the second heating process.

17. The method according to claim 16, further comprising, after the performing of the second heating process, forming another insulating layer on the semiconductor substrate, and forming a contact hole in the other insulating layer.

\* \* \* \* \*